(12) United States Patent
Koshimizu et al.

(10) Patent No.: US 10,804,072 B2
(45) Date of Patent: Oct. 13, 2020

(54) PLASMA PROCESSING APPARATUS

(71) Applicant: TOKYO ELECTRON LIMITED, Minato-ku (JP)

(72) Inventors: Chishio Koshimizu, Nirasaki (JP); Naoki Matsumoto, Amagasaki (JP); Satoshi Tanaka, Nirasak (JP); Toru Ito, Nirasaki (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 48 days.

(21) Appl. No.: 16/004,898

(22) Filed: Jun. 11, 2018

(65) Prior Publication Data

US 2018/0294137 A1    Oct. 11, 2018

Related U.S. Application Data

(62) Division of application No. 15/258,481, filed on Sep. 7, 2016, which is a division of application No. (Continued)

(30) Foreign Application Priority Data

Mar. 28, 2007 (JP) .................. 2007-084706

(51) Int. Cl.
*H01J 37/32* (2006.01)
*H01J 37/21* (2006.01)

(52) U.S. Cl.
CPC ........ *H01J 37/21* (2013.01); *H01J 37/32091* (2013.01); *H01J 37/32155* (2013.01);
(Continued)

(58) Field of Classification Search
USPC ............... 156/345.51–345.55; 118/728–730; 361/234
See application file for complete search history.

(56) References Cited

U.S. PATENT DOCUMENTS 5,310,453 A    5/1994 Fukasawa et al.
5,556,500 A    9/1996 Hasegawa et al.
(Continued)

FOREIGN PATENT DOCUMENTS

JP    2000-36490    2/2000
JP    2003-163201    6/2003
(Continued)

*Primary Examiner* — Rakesh H Dhingra
(74) *Attorney, Agent, or Firm* — Oblon, McClelland, Maier & Neustadt, L.L.P.

(57) ABSTRACT

A plasma processing apparatus includes a processing chamber, a first electrode and a second electrode disposed to face each other, a high frequency power supply unit for applying a high frequency power to either the first electrode or the second electrode, a processing gas supply unit for supplying a processing gas to a processing space, and a main dielectric member provided at a substrate mounting portion on a main surface of the first electrode. A focus ring is attached to the first electrode to cover a peripheral portion of the main surface of the first electrode and a peripheral dielectric member is provided in a peripheral portion on the main surface of the first electrode so that an electrostatic capacitance per unit area applied between the first electrode and the focus ring is smaller than that applied between the first electrode and the substrate by the main dielectric member.

20 Claims, 10 Drawing Sheets

Related U.S. Application Data

13/618,587, filed on Sep. 14, 2012, now abandoned, which is a division of application No. 12/056,665, filed on Mar. 27, 2008, now Pat. No. 8,298,371.

(60) Provisional application No. 60/912,949, filed on Apr. 20, 2007.

(52) U.S. Cl.
CPC .. *H01J 37/32165* (2013.01); *H01J 37/32348* (2013.01); *H01J 37/32449* (2013.01); *H01J 37/32467* (2013.01); *H01J 37/32642* (2013.01); *H01J 2237/21* (2013.01); *H01J 2237/334* (2013.01)

(56) References Cited

U.S. PATENT DOCUMENTS

| | | | |
|---|---|---|---|
| 5,606,485 A * | 2/1997 | Shamouilian | H01L 21/6833 |
| | | | 361/234 |
| 5,766,363 A | 6/1998 | Mizuno et al. | |
| 5,919,332 A | 7/1999 | Koshiishi et al. | |
| 6,475,336 B1 | 11/2002 | Hubacek | |
| 6,676,804 B1 | 1/2004 | Koshimizu et al. | |
| 6,954,585 B2 | 10/2005 | Mokuo | |
| 2001/0022293 A1 | 9/2001 | Maeda et al. | |
| 2002/0029745 A1 | 3/2002 | Nagaiwa et al. | |
| 2002/0059981 A1 | 5/2002 | Hao et al. | |
| 2003/0106647 A1* | 6/2003 | Koshiishi | C23C 16/4585 |
| | | | 156/345.53 |
| 2004/0255863 A1* | 12/2004 | Higashiura | H01J 37/32082 |
| | | | 118/723 E |
| 2004/0261946 A1 | 12/2004 | Endoh | |
| 2005/0034674 A1 | 2/2005 | Ono | |
| 2005/0039682 A1 | 2/2005 | Dhindsa et al. | |
| 2005/0155718 A1 | 7/2005 | Huang et al. | |
| 2007/0169891 A1 | 7/2007 | Koshiishi | |
| 2009/0186487 A1 | 7/2009 | Chang et al. | |

FOREIGN PATENT DOCUMENTS

| | | |
|---|---|---|
| JP | 2004-235623 | 8/2004 |
| JP | 2005-064460 | 3/2005 |
| JP | 2005-113178 A | 4/2005 |
| JP | 2005-277369 | 10/2005 |
| JP | 2005-539397 | 12/2005 |
| JP | 2006-270019 A | 10/2006 |
| JP | 2006-319043 | 11/2006 |
| KR | 10-2004-0050080 A | 6/2004 |
| KR | 10-2006-0022149 A | 3/2006 |
| KR | 10-2007-0097924 A | 10/2007 |

* cited by examiner

PLASMA PROCESSING APPARATUS

CROSS-REFERENCE TO RELATED APPLICATIONS

This application is a divisional application of U.S. patent application Ser. No. 15/258,481, filed on Sep. 7, 2016, which is a divisional application of U.S. patent application Ser. No. 13/618,587 filed on Sep. 14, 2012, which is a divisional application of U.S. patent application Ser. No. 12/056,665 filed on Mar. 27, 2008 (now U.S. Pat. No. 8,298,371, issued Oct. 30, 2012). U.S. patent application Ser. No. 12/056,665 claims the benefit of priority under 35 U.S.C. § 119(e) to U.S. Provisional Application Ser. No. 60/912,949 filed on Apr. 20, 2007, and claims the benefit of priority under 35 U.S.C. § 119 from Japanese Patent Application No. 2007-084706 filed on Mar. 28, 2007. The entire contents of the above-noted applications are incorporated herein by reference.

FIELD OF THE INVENTION

The present invention relates to a technique for performing a plasma processing on a target substrate; and, more particularly, to a capacitively coupled plasma processing apparatus in which a focus ring is attached to an electrode for supporting a substrate.

BACKGROUND OF THE INVENTION

In a single sheet capacitively coupled plasma processing apparatus, a susceptor and a facing electrode (upper electrode) have diameters a little bit larger than that of a substrate in order to improve in-plane uniformity of a density of plasma (especially, uniformity in a radial direction of a substrate) applied to a surface of a substrate to be processed on a susceptor (generally, lower electrode) inside a chamber. In this case, if a peripheral portion of a top surface of the susceptor which is projected outwardly in the radial direction of the substrate is directly exposed to the plasma, the peripheral portion is damaged and deteriorated by ion bombardment from the plasma. Especially, in a plasma etching apparatus, since ions are accelerated to be introduced by using a DC voltage or a self-bias voltage generated in the susceptor, an ion sputtering effect is increased. Therefore, the susceptor is protected from the plasma by detachably attaching a ring-shaped covering member, i.e., a so-called focus ring, so as to cover the peripheral portion of the top surface of the susceptor which is projected outwardly in the radial direction of the substrate (see, e.g., Japanese Patent Laid-open Application No. 2000-36490).

The focus ring is made of a material that does not substantially affect the plasma processing on the substrate even if part of the material is scattered around by sputtering. For example, Si, SiC, C (carbon) or the like is used in a plasma etching of an oxide film, and $SiO_2$ is used in a plasma etching of polysilicon.

In the plasma processing apparatus, whenever the plasma processing is carried out, the focus ring sputters by the effect of the ion bombardment from the plasma, and the wastage thereof increases temporally. For that reason, the focus ring is considered as a consumable or a replaceable item. Since the focus ring is high-priced, a COC (cost of consumable) thereof deteriorates as a life span or an exchanging cycle thereof is shortened.

Recently, a high frequency power used in the plasma processing increases due to improvement in processing performance, processing time reduction or the like. Accordingly, the energy of plasma ions increases, and the wear rate of the focus ring increases. Especially, in a dual frequency application type in which two high frequency powers are superposed and applied to the susceptor, a high-density plasma is generated by a higher frequency power and ions are attracted to the substrate by a lower frequency power such that the energy of the ions bombarding the focus ring is further increased, resulting in a remarkable deterioration of the COC (Cost of Consumable) of the focus ring.

SUMMARY OF THE INVENTION

In view of the above, the present invention provides a plasma processing apparatus capable of effectively suppressing a consumption of a focus ring without substantially affecting processes.

In accordance with a first aspect of the present invention, there is provided a plasma processing apparatus comprising: an evacuable processing chamber; a first electrode for supporting a target substrate in the processing chamber; a second electrode disposed to face the first electrode; a first high frequency power supply unit for applying a first high frequency power having a first frequency to either the first electrode or the second electrode; a processing gas supply unit for supplying a processing gas to a processing space formed between the first electrode and the second electrode; a main dielectric member provided in a substrate mounting portion on a main surface of the first electrode; a focus ring attached to the first electrode to cover a peripheral portion of the main surface of the first electrode positioned in an outer side of the substrate mounting portion; and a peripheral dielectric member provided in the peripheral portion on the main surface of the first electrode so that an electrostatic capacitance per unit area applied between the first electrode and the focus ring is smaller than an electrostatic capacitance per unit area applied between the first electrode and the substrate by the main dielectric member.

With such configuration, the peripheral dielectric member has a smaller electrostatic capacitance per unit area and a higher impedance than those of the main dielectric member. Therefore, in the case of a second high frequency, it is relatively difficult to pass through a propagation path of the peripheral dielectric member and the focus ring, and is relatively easy to pass through a propagation path of the main dielectric member and the substrate. As a consequence, the electric field in the ion sheath formed on the focus ring becomes relatively weak, thus decreasing the energy of ions bombarding the focus ring and suppressing the consumption of the focus ring.

It is preferable that the peripheral dielectric member and the main dielectric member are made of a same material and integratedly formed. Further, the peripheral dielectric member may have a thickness greater than the thickness of the main dielectric member. The peripheral dielectric member may be in a hollow shape and have therein a fluid dielectric member of which volume is variable.

It is further preferable that the focus ring comprises a first ring-shaped member provided near an outer edge of the main dielectric member and a second ring-shaped member disposed near an outer peripheral surface of the first ring-shaped member. Furthermore, the first ring-shaped member may be disposed so that a gap formed between an outer edge of the substrate supported on the main dielectric member and an inner peripheral surface of the second ring-shaped member is positioned above the first ring-shaped member. In this focus ring of the two-piece structure, when the first ring-shaped member and the second ring-shaped member have different wear rates, a ring-shaped member of which life span has reached its limit can be exclusively exchanged with a new one.

A conductor may be provided in the main dielectric member, and a DC voltage for generating an electrostatic attraction force to the substrate is applied to the conductor. Further, a second conductor may be provided in the peripheral dielectric member, and a DC voltage for generating an electrostatic attraction force to the focus ring is applied to the second conductor. In this focus ring of the two-piece structure, a conductor for generating an electrostatic attraction force to the focus ring may be provided in the peripheral dielectric member to face the second-ring shaped member.

It is preferable that a first thermally conductive gas supply unit for supplying a thermally conductive inert gas is provided between the main dielectric member and the substrate. Further, a second thermally conductive gas supply unit for supplying a thermally conductive inert gas may be provided between the peripheral dielectric member and the focus ring.

A second high frequency power supply unit may apply to the first electrode a second high frequency power having a second frequency lower than the first frequency. In that case, as for the frequency (first frequency) of the first high frequency power, a frequency suitable for plasma generation is selected. Also, as for the frequency (second frequency) of the second high frequency power, a frequency suitable for ion attraction is selected. The effects of the embodiment of present invention are more apparent in the second high frequency than in the first high frequency. Namely, it is difficult for the relatively low second frequency to pass through the propagation path of the peripheral dielectric member and the focus ring due to the high impedance thereof. Hence, the ion bombardment on the focus ring can be suppressed and, further, the consumption of the focus ring can be effectively suppressed.

In accordance with a second aspect of the present invention, there is provided a plasma processing apparatus comprising: an evacuable processing chamber; a first electrode for supporting a target substrate in the processing chamber; a second electrode disposed to face the first electrode; a first high frequency power supply unit for applying a first high frequency power having a first frequency to either the first electrode or the second electrode; a processing gas supply unit for supplying a processing gas to a processing space formed between the first electrode and the second electrode; a main dielectric member provided in a substrate mounting portion on a main surface of the first electrode; a focus ring attached to the first electrode to cover a peripheral portion of the main surface of the first electrode positioned at an outer side of the substrate mounting portion; a peripheral insulating member provided at a peripheral portion on the main surface of the first electrode contacted with the focus ring; and an electrostatic capacitance varying unit for varying an electrostatic capacitance of the peripheral insulating portion.

With such configuration, the ion sheath distribution or the plasma density distribution on the semiconductor wafer W and the focus ring 36 can be controlled at will by varying the electrostatic capacitance of the peripheral insulating member with the use of the electrostatic capacitance varying mechanism.

In accordance with a third aspect of the present invention, there is provided a plasma processing apparatus comprising: an evacuable processing chamber; a main lower electrode for supporting a target substrate in the processing chamber; a peripheral lower electrode extending in a ring shape to surround an outer periphery of the main lower electrode, the peripheral lower electrode being electrically insulated from the main lower electrode; a focus ring attached to cover a top surface of the peripheral lower electrode; an upper electrode disposed above the main lower electrode and the peripheral lower electrode to face thereto; a processing gas supply unit for supplying a processing gas to a processing space formed between the main lower electrode and the upper electrode; a first high frequency power supply unit for applying a first high frequency power having a first frequency to the main lower electrode and the peripheral lower electrode; and a second high frequency power supply unit for applying a second high frequency power having a second frequency lower than the first frequency to the main lower electrode.

With such configuration, the second high frequency power having a relatively low frequency is applied to the main lower electrode without being applied to the peripheral lower electrode. Therefore, the ions are attracted from the plasma to the substrate on the main lower electrode and, also, the focus ring on the peripheral lower electrode can be prevented from the ion bombardment. Meanwhile, the first high frequency power having a relatively high frequency is divided and transmitted toward the processing space via the propagation path of the main lower electrode and that of the peripheral lower electrode and, then, the processing gas is plasma-excited above the focus ring as well as above the substrate. Since the plasma is generated above the focus ring as well as above the substrate, the characteristics of the plasma density distribution on the semiconductor wafer W are improved.

In accordance with the above-described configuration and operation of the plasma processing apparatus of the present invention, the consumption of the focus ring can be suppressed without substantially affecting the processes.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Hereinafter, embodiments of the present invention will be described with reference to FIGS. 1 to 15 which form a part hereof.

Figure 1:
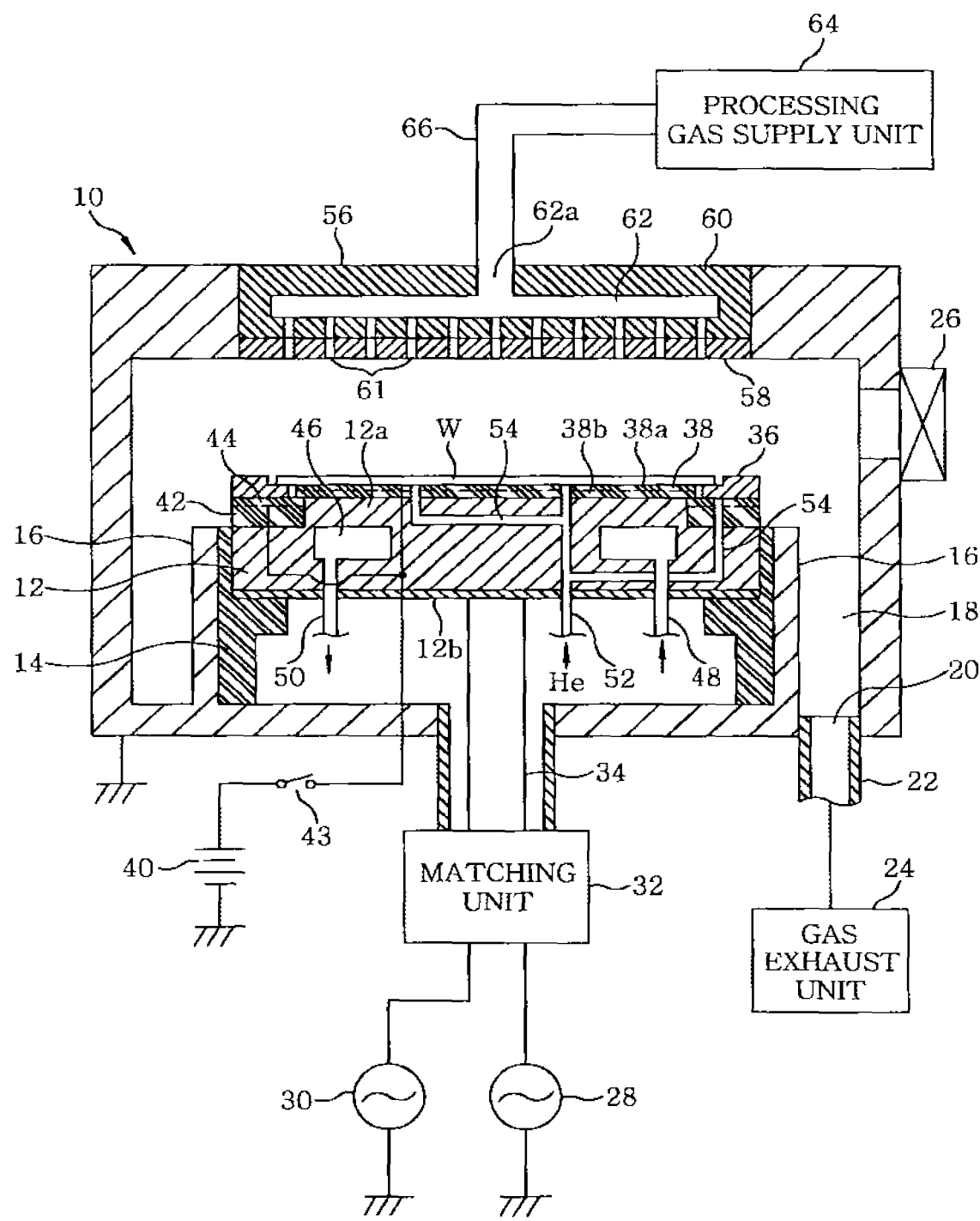
FIG. 1 is a vertical cross sectional view showing a configuration of a plasma etching apparatus in accordance with an embodiment of the present invention.

FIG. 1 is a vertical cross sectional view showing a configuration of a plasma etching apparatus in accordance with an embodiment of the present invention. This plasma etching apparatus is constructed as a capacitively coupled cathode couple plasma etching apparatus, and includes a cylindrical chamber (processing chamber) 10 made of a metal such as aluminum, stainless steel or the like. The chamber 10 is frame grounded.

A circular plate-shaped susceptor 12 serving as a lower electrode for mounting thereon a target substrate, e.g., a semiconductor wafer W, is horizontally arranged in the chamber 10. The susceptor 12 has a main body or a base 12a made of, e.g., aluminum, and a conductive RF plate 12b fixed to a bottom surface of the base 12a. Further, the susceptor 12 is supported by a cylindrical insulating supporting portion 14 extending vertically upward from a bottom of the chamber 10. A ring-shaped exhaust passage 18 is formed between an inner wall of the chamber 10 and a cylindrical conductive supporting portion 16 extending vertically upward from the bottom of the chamber 10 around a cylindrical outer surface of the cylindrical supporting portion 14.

Moreover, a gas exhaust port 20 is provided at the end of the exhaust passage 18. A gas exhaust unit 24 is connected to the gas exhaust port 20 via a gas exhaust line 22. The gas exhaust unit 24 has a vacuum pump such as a turbo-molecular pump or the like, so that a processing space in the chamber 10 can be depressurized to a required vacuum level. Attached to a sidewall of the chamber 10 is a gate valve 26 for opening and closing a loading/unloading port of a semiconductor wafer W.

A first and a second high frequency power supply 30 and 28 are electrically connected to the susceptor 12 via a matching unit 32 and a power supply rod 34. Here, the first high frequency power supply 30 outputs a first high frequency power having a predetermined frequency, e.g., 40 MHz, for generating a plasma. Meanwhile, the second high frequency power supply 28 outputs a second high frequency power having a predetermined frequency, e.g., 2 MHz, for attracting ions to the semiconductor wafer W on the susceptor 12. The matching unit 32 has therein a first matching device for matching an impedance between the first high frequency power supply 30 and a load (mainly, an electrode, a plasma and a chamber) and a second matching device for matching an impedance between the second high frequency power supply 28 and the load.

The susceptor 12 has a diameter a little bit larger than that of the semiconductor wafer W. A main surface, i.e., a top surface, of the susceptor 12 is divided into two regions including a central region, i.e., a wafer mounting portion, having substantially the same shape (circular shape) or substantially the same size as that of the wafer W and a ring-shaped peripheral region extending outward from an outer periphery of the wafer mounting portion. The semiconductor wafer W as an object to be processed is mounted on the wafer mounting portion, and a focus ring 36 having an inner diameter slightly larger than the diameter of the semiconductor wafer W is attached to the ring-shaped peripheral region. Preferably, the focus ring 36 is made of a material, e.g., Si, SiC, C, $SiO_2$ or the like, depending on an etching target material of the semiconductor wafer W, and can have a conventional shape.

An electrostatic chuck 38 for attracting and holding the wafer is provided on the wafer mounting portion of the top surface of the susceptor 12. The electrostatic chuck 38 is formed by embedding a sheet-shaped or a mesh-shaped conductor 38b in a film-shaped or a plate-shaped dielectric member 38a, and is integratedly secured to or formed with the base 12a of the susceptor 12. In addition, a DC power supply 40 installed outside the chamber 10 is electrically connected to the conductor 38b via wiring and a switch 43. The semiconductor wafer W can be attracted and held on the electrostatic chuck 38 by Coulomb force generated by a DC voltage applied from the DC power supply 40.

The peripheral region on the top surface of the susceptor 12 is provided with a ring-shaped peripheral dielectric member 42 being in direct contact with a bottom surface of the focus ring 36. The peripheral dielectric member 42 is also integratedly secured to or formed with the base 12a of the susceptor 12. In the illustrated example, a sheet-shaped or a mesh-shaped conductor 44 is embedded in the peripheral dielectric member 42, and is also electrically connected to the DC power supply 40. By applying the DC voltage from the DC power supply 40 to the conductor 44, the focus ring 36 can be attracted and held on the conductor 44 by Coulomb force. Namely, the peripheral dielectric member 42 and the conductor 44 form a peripheral electrostatic chuck 45 for attracting and holding the focus ring 36.

A ring-shaped coolant reservoir 46 extending in, e.g., a circumferential direction, is provided inside the susceptor 12. A coolant, e.g., cooling water, maintained at a predetermined temperature is supplied from a chiller unit (not shown) to the coolant reservoir 46 via lines 48 and 50 so as to be circulated therein. A temperature of the semiconductor wafer W on the electrostatic chuck 38 and that of the focus ring 36 on the peripheral electrostatic chuck 45 can be controlled by the temperature of the coolant. In general, in order to increase the accuracy in controlling the temperatures of the wafer and the focus ring, a thermally conductive gas, e.g., He gas, is supplied from a thermally conductive gas supply unit (not shown) between a main electrostatic chuck 38 and the semiconductor wafer W and between a peripheral electrostatic chuck 45 and the focus ring 36 via a gas supply line 52 and a gas channel 54 in the susceptor 12.

A shower head 56 facing the susceptor 12 in parallel is provided at a ceiling portion of the chamber 10, and serves also as an upper electrode of a ground potential. Moreover, the shower head 56 has an electrode plate 58 facing the susceptor 12 and an electrode support 60 for attachably/detachably supporting the electrode plate 58 from its backside (upside). A gas chamber 62 is provided in the electrode support 60, and a plurality of gas discharge openings 61 extending from the gas chamber 62 to the susceptor 12 is formed in the electrode support 60 and the electrode plate 58. A space formed between the electrode plate 58 and the susceptor 12 becomes a plasma generation space or a processing space. A gas supply line 66 from a processing gas supply unit 64 is connected to a gas inlet port 62a provided at an upper portion of the gas chamber 62. The electrode plate 58 is made of, e.g., Si or SiC, and the electrode support 60 is made of, e.g., alumite treated aluminum.

A control unit (not shown) including, e.g., a microcomputer, independently controls each unit in the plasma etching apparatus, such as the gas exhaust unit 24, the high frequency power supplies 28 and 30, the switch 43 of the DC power supply 40, the chiller unit (not shown), the thermally conductive gas supply unit (not shown), the processing gas supply unit 64 and the like, and also controls an entire operation (sequence) of the apparatus.

In the plasma processing apparatus, in order to perform the etching, the semiconductor wafer W to be processed is loaded into the chamber 10 while opening the gate valve 26 and then mounted on the electrostatic chuck 38. Next, an etching gas (generally, a gaseous mixture) is introduced into the chamber 10 at a predetermined flow rate and flow rate ratio from the processing gas supply unit 64, and a pressure inside the chamber 10 is set to be at a predetermined level by using the gas exhaust unit 24. Then, the first and the second high frequency power supply 30 and 28 are turned on to thereby output the first high frequency (40 MHz) and the second high frequency (2 MHz) at respective specific power levels. These frequencies are applied to the susceptor 12 via the matching unit 32 and the power supply rod 34.

Thereafter, the switch 43 is turned on, and the thermally conductive gas (He gas) is confined by electrostatic attraction force in a contact interface between the main electrostatic chuck 38 and the semiconductor wafer W and that between the peripheral electrostatic chuck 45 and the focus ring 36. The etching gas discharged through the shower head 56 is converted into a plasma between both electrodes 12 and 56 by a high frequency discharge, and the main surface of the semiconductor wafer W is etched by radicals or ions generated in the plasma.

In this capacitively coupled plasma etching apparatus, by applying to the susceptor 12 the first high frequency power of a relatively high frequency, e.g., 40 MHz, suitable for plasma generation, a plasma is highly densified in a desirable dissociated state so that a high-density plasma can be generated even at a low pressure. Also, by applying to the susceptor 12 the second high frequency power of a relatively low frequency, e.g., 2 MHz, suitable for ion attraction, it is possible to perform an anisotropic etching having high selectivity to the semiconductor wafer W on the susceptor 12.

Hereinafter, configurations and operations of features of the plasma etching apparatus of this embodiment will be described in detail.

Figure 2:
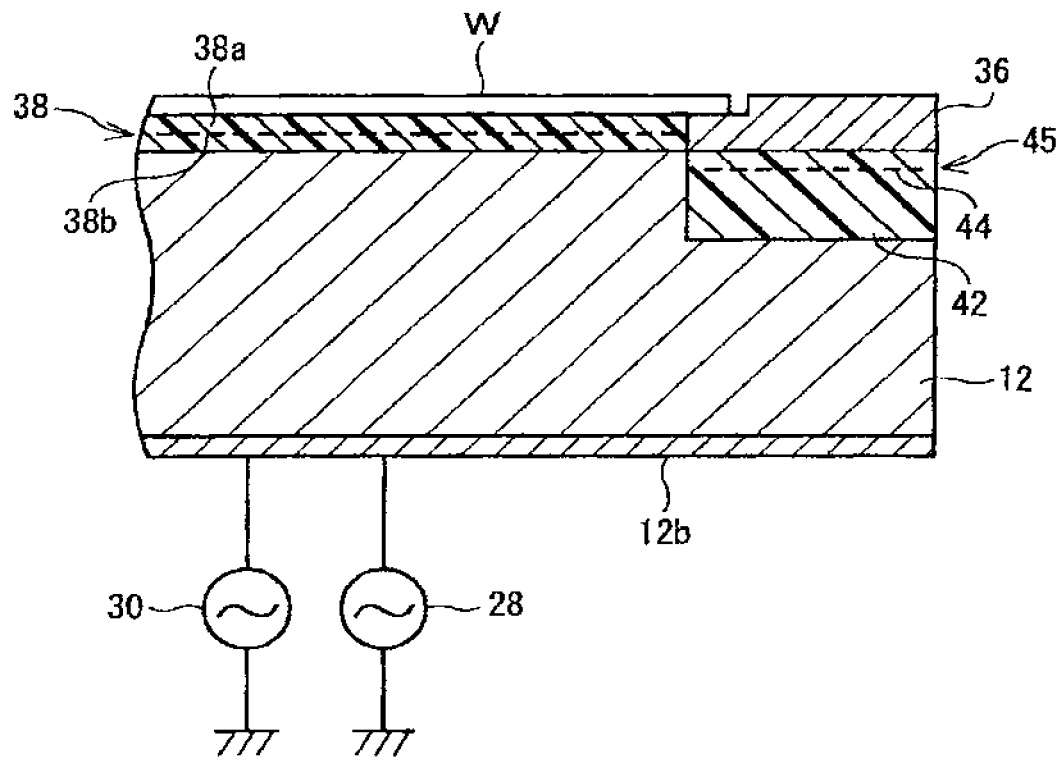
FIG. 2 illustrates a partial enlarged cross sectional view of principal parts (structures in a vicinity of a focus ring) of the embodiment of the present invention.
Figure 3:
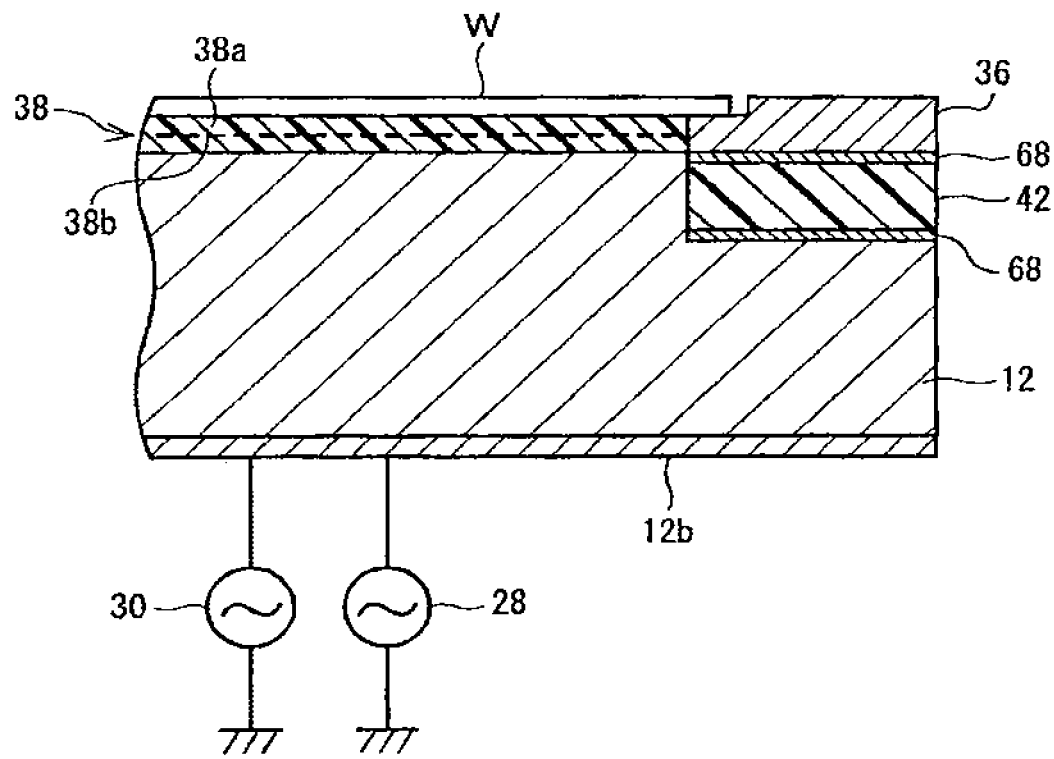
FIG. 3 provides a partial enlarged cross sectional view of modifications of the principal parts of the embodiment of the present invention.

FIG. 2 provides an enlarged view of structures in the vicinity of the focus ring 36 on the top surface of the susceptor 12. As illustrated in FIG. 2, the dielectric member 42 of the peripheral electrostatic chuck 45 has a much thicker thickness than that of the dielectric member 38a of the main electrostatic chuck 38. Here, both of the dielectric members 42 and 38a may be made of different members or a same material, e.g., alumina ($Al_2O_3$). In the above example, the top surface of the semiconductor wafer W mounted on the main electrostatic chuck 38 is substantially on a same plane as the top surface of the focus ring 36, so that the peripheral electrostatic chuck 45 is located at a much lower position than the main electrostatic chuck 38. When the main electrostatic chuck 38 is formed by a thermal spraying method, it can be integratedly formed with the peripheral electrostatic chuck 45 or together therewith.

Due to the difference in the structure (especially, thickness) of the dielectric members 42 and 38a, an electrostatic capacitance per unit area provided between the susceptor 12 and the focus ring 36 by the peripheral dielectric member 42 is relatively smaller than that provided between the susceptor 12 and the semiconductor wafer W by the main dielectric member 38a. Accordingly, an impedance provided by the peripheral dielectric member 42 is higher than an impedance provided by the main dielectric member 38a with respect to the high frequencies (40 MHz and 2 MHz) supplied from the first and the second high frequency power supply 30 and 28. Especially, it should be noted that a higher impedance is provided by the peripheral dielectric member 42 than by the main dielectric member 38a with respect to the second high frequency (2 MHz) that is relatively low.

While the etching process is performed, the first high frequency (40 MHz) and the second high frequency (2 MHz) supplied from the high frequency power supplies 30 and 28 are supplied to an upper space via the susceptor 12, the electrostatic chucks 38 and 45, the semiconductor wafer W and the focus ring 36 and, then, the etching gas is plasma-excited. Here, the generation of electron-ion pairs (ionization) in the plasma processing space is dominantly affected by the first high frequency (40 MHz), and the formation of an electric field by the attraction of accelerated ions to the susceptor 12 is dominantly affected by the second high frequency (2 MHz).

Thus, during the etching process, the plasma is generated above the focus ring 36 as well as above the semiconductor wafer W. Accordingly, the ions are attracted to the focus ring 36 as well as to the semiconductor wafer W.

In this plasma etching apparatus, the peripheral dielectric member 42 has a smaller electrostatic capacitance per unit area and a higher impedance than that of the main dielectric member 38a. Therefore, in the case of the second high frequency (2 MHz) that is relatively low between the two high frequencies, it is relatively difficult to pass through a propagation path of the peripheral dielectric member 42 and the focus ring 36, and is relatively easy to pass through a propagation path of the main dielectric member 38a and the semiconductor wafer W.

As a consequence, the electric field in the ion sheath formed on the focus ring 36 becomes relatively weak, thereby decreasing the energy of ions bombarding the focus ring 36 and suppressing the consumption of the focus ring 36. On the contrary, the electric field formed on the semiconductor wafer W becomes relatively strong, so that the etching rate and the verticality (anisotropy) of the etching process are improved. Further, even in the case of the first high frequency (40 MHz), it is relatively more difficult to pass through the propagation path of the peripheral dielectric member 42 than to pass through the propagation path of the main dielectric member 38a. However, the impedance of the first frequency (40 MHz) is smaller than that of the second high frequency by a factor of $1/20$, so that it is not as difficult as for the first high frequency to pass therethrough in comparison to the case of the second high frequency.

By providing a conductor 44 in the peripheral dielectric member 42, the peripheral electrostatic chuck 45 can attract and hold the focus ring 36 by the Coulomb force and, also, thermal coupling between the susceptor 12 cooled by a coolant gas and the focus ring 35 can be increased as much as possible. Besides, there can be employed a configuration illustrated in FIG. 3 in which a thermally conductive sheet 68 made of, e.g., a silicon rubber sheet or the like, is inserted to a contact interface between the peripheral dielectric member 42 and the susceptor 12 and that between the peripheral dielectric member 42 and the focus ring 36 without providing the conductive material 44 in the peripheral dielectric member 42.

As set forth above, in the plasma etching apparatus of this embodiment, the heat input to the focus ring 36 can become smaller as a thickness of the peripheral dielectric member 42 becomes thicker and an electrostatic capacitance between the susceptor 12 and the focus ring 36 becomes smaller.

Figure 4:
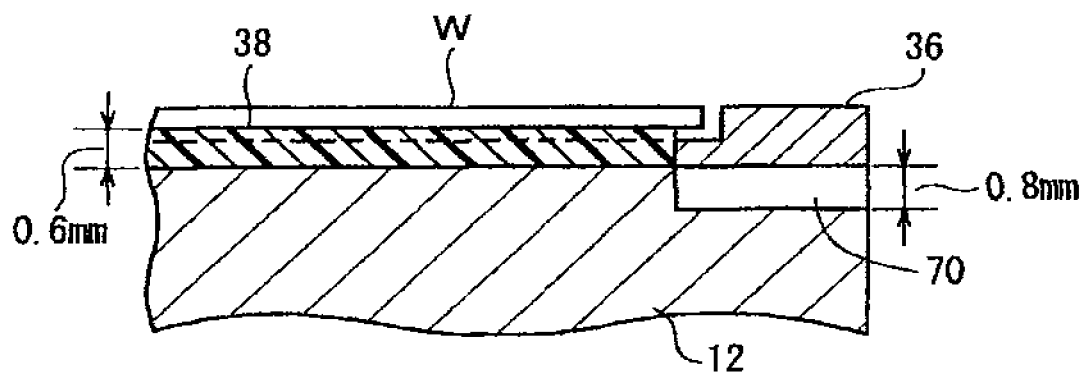
FIG. 4 presents a partial enlarged cross sectional view of a configuration of principal parts of a model used for verifying effects of the present invention.
Figure 5:
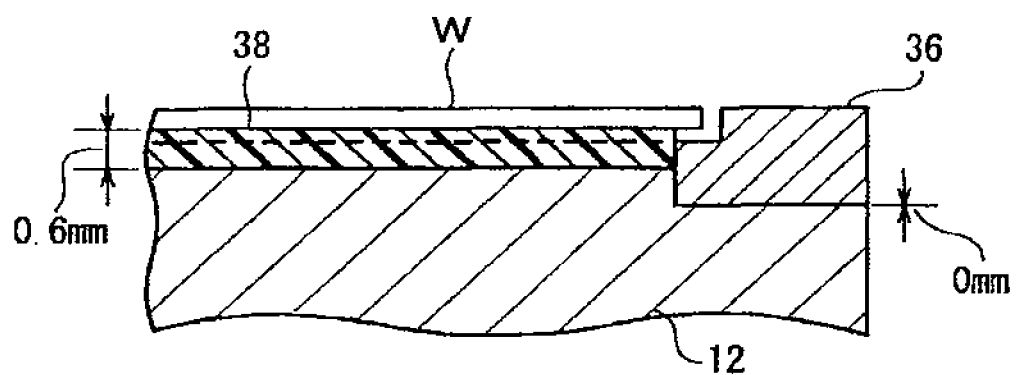
FIG. 5 represents a partial enlarged cross sectional view of a configuration of principal parts of an additional model used for verifying the effects of the present invention.
Figure 6:
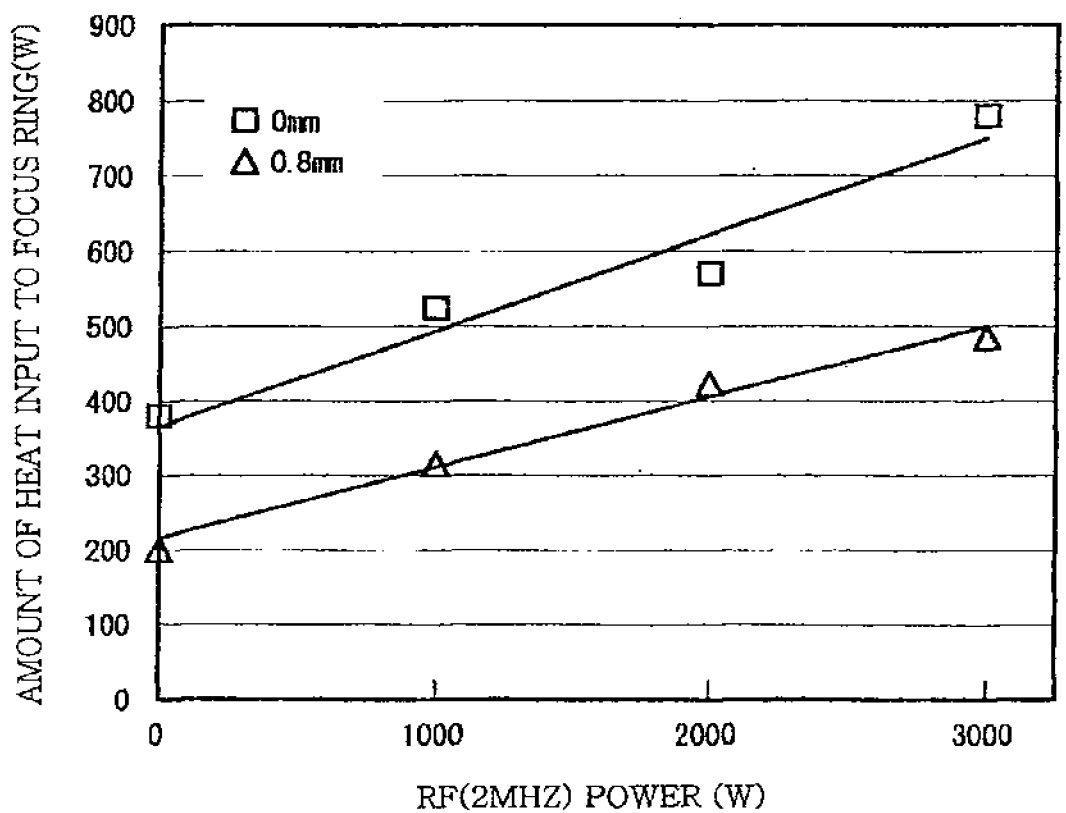
FIG. 6 offers a graph showing a relationship between a high frequency power and a heat input to the focus ring that is obtained as a result of the verification.

FIGS. 4 to 6 present examples for verifying the effects of the present invention in the case of varying the electrostatic capacitance between the susceptor 12 and the focus ring 36. These examples represent two cases in which the focus ring 36 is installed above the susceptor 12 with a distance of about 0.8 mm therebetween as shown in FIG. 4 and in which the focus ring 36 is tightly adhered to the susceptor 12 (gap=0 mm) as shown in FIG. 5. In each of the above two cases, there is measured a relationship between the heat input to the focus ring 36 and the power of the second high frequency (2 MHz) which dominantly affects the attraction of ions. The measurement results are shown in FIG. 6. Here, the heat input to the focus ring 36 is obtained from the temperature increasing rate, and is in proportion to the sputtering energy or the sputtering amount. Moreover, a thickness of the main electrostatic chuck 38 is about 0.6 mm.

Referring to the measured data shown in FIG. 6, it is clear that when the focus ring 36 is lifted by about 0.8 mm (FIG. 4), the heat input to the focus ring 36 is reduced to about ⅔ of that measured when the focus ring 36 is not lifted at all (FIG. 5). Thus, it is estimated that the sputtering amount in the focus ring 36 is reduced to about ⅔ and, further, it is expected that the life span of the focus ring 36 is extended about 1.5 times.

In the example of FIG. 4, in order to support the lifted focus ring 36, spacers made of glass (not shown) which have a height of about 0.8 mm are inserted between the focus ring 36 and the susceptor 12, the spacers being spaced from each other at predetermined intervals (e.g., 120° C.) in a circumferential direction.

Meanwhile, in the example of FIG. 4, a gap space 70 formed between the focus ring 36 and the susceptor 12 is in vacuum of a dielectric constant of 1. If the gap space 70 is filled with the peripheral dielectric member 42, e.g., wherein a dielectric constant of the peripheral dielectric member 42 is 9 (alumina), then the electrostatic capacitance equivalent to that of the gap space 70 can be obtained by choosing a thickness of the peripheral dielectric member 42 to be 7.2 mm (0.8 mm×9). Namely, in case the main electrostatic chuck 38 and the peripheral dielectric member are made of a same alumina material, by making the thickness of the peripheral dielectric member 42 12 times thicker than that of the main electrostatic chuck 38 (7.2 mm/0.6 mm), the electrostatic capacitance equivalent to that of the example shown in FIG. 4 can be obtained.

The life span of the focus ring 36 can be greatly extended by making the thickness of the peripheral dielectric member 42 as thick as possible, preferably at least 10 times thicker than that of the main electrostatic chuck 38. However, if the thickness of the peripheral dielectric member 42 increases excessively, it is difficult for the first high frequency (40 MHz) to pass therethrough. Accordingly, the generation of the plasma in the space above the focus ring 36 becomes weakened and, further, the plasma density distribution on the semiconductor wafer W is adversely affected. Thus, the thickness of the peripheral dielectric member 42 should not be increased indefinitely, and is preferably set to be no more than 20 times that of the main electrostatic chuck 38.

Hereinafter, application examples of the plasma etching apparatus in accordance with the embodiment of the present invention will be described with reference to FIGS. 7 to 13.

Figure 7:
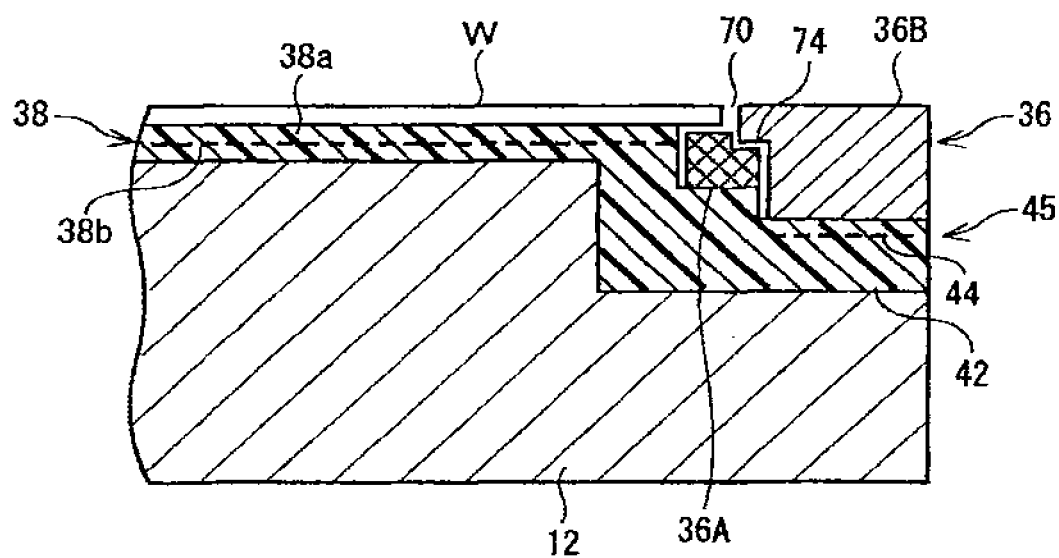
FIG. 7 shows a partial enlarged cross sectional view depicting a configuration of principal parts of an application example in the embodiment of the present invention.

In the application example of FIG. 7, the focus ring 36 is divided in a radial direction into two pieces, i.e., an inner focus ring 36A and an outer focus ring 36B. To be more specific, the inner focus ring 36A is positioned near an outer edge of the main electrostatic chuck 38, and the outer focus ring 36B is positioned near an outer peripheral surface of the inner focus ring 36A. Further, the inner focus ring 36A is disposed so that the gap 70 formed between the outer edge of the semiconductor wafer W held on the main electrostatic chuck 38 and an inner peripheral surface of the outer focus ring 36B can be positioned on the inner focus ring 36A. Moreover, a gap 74 between the inner focus ring 36A and the outer focus ring 36B has a labyrinthian structure.

In general, the focus ring is consumed from the top, and especially an inner peripheral portion thereof adjacent to the outer edge of the target substrate is consumed first due to the strong ion sputtering. In the two-piece structure of FIG. 7, the inner focus ring 36A is consumed faster than the outer focus ring 36B. Here, the focus rings 36A and 36B are individual members and thus can be separately exchanged. When the life span of the inner focus ring 36A reaches its limit, only the inner focus ring 36A is exchanged with a new one, and the outer focus ring 36B can be used continuously.

Further, even if the ions are applied to the gap 74 formed between the inner focus ring 36A and the outer focus ring 36B, the ions bombard only the wall of the labyrinth, so that the ions do not reach the peripheral electrostatic chuck 45 or the peripheral dielectric member 42.

Moreover, in the peripheral electrostatic chuck 45, since the outer focus ring 36B presses downward the inner focus ring 36A through the contact surfaces of the labyrinthian structure, the conductor 44 may be provided only in the area to be positioned directly under the outer focus ring 36B.

Figure 8:
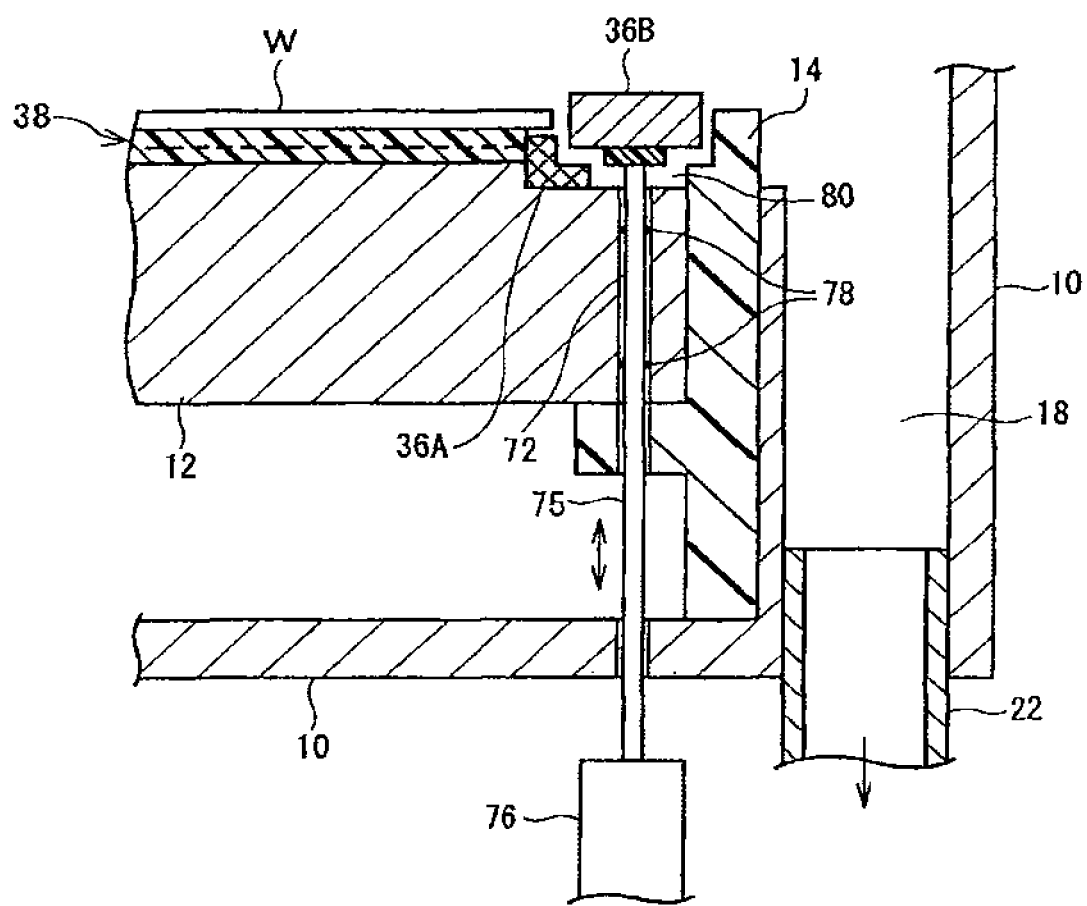
FIG. 8 illustrates a partial enlarged cross sectional view describing a configuration of principal parts of another application example in the embodiment of the present invention.

In the application example of FIG. 8, the focus ring 36 can be separated upward from the susceptor 12 and, also, a height position thereof can be variably adjusted. A through hole 72 perpendicular to the susceptor 12 is formed directly under the focus ring 36. A leading end of a supporting rod 75 movable through the through hole 72 is coupled to a bottom surface of the focus ring 36. A base end of the supporting rod 75 is coupled to or supported by an actuator 76 installed outside the chamber 10. The height position of the focus ring 36 can be adjusted at will by a vertical movement of the supporting rod 75 by the actuator 76. The through hole 72 is provided with a seal member 78 such as an O-ring or the like. In the aforementioned example, the focus ring 36 is divided into two pieces, i.e., the inner focus ring 36A and the outer focus ring 36B, and the height position of the outer focus ring 36B is variable.

The through hole 72, the supporting rod 75 and the actuator 76 are provided at a plurality of locations (e.g., three locations) while being spaced from each other at predetermined intervals in a circumferential direction.

In the above configuration, a vacuum gap 80 formed between the focus ring 36B and the susceptor 12 serves as an insulating portion for providing an electrostatic capacitance. Although a gap width (thickness) of the vacuum gap 80 is small, the electrostatic capacitance can be greatly reduced because of a very small dielectric constant of the vacuum gap 80.

Figure 9A:
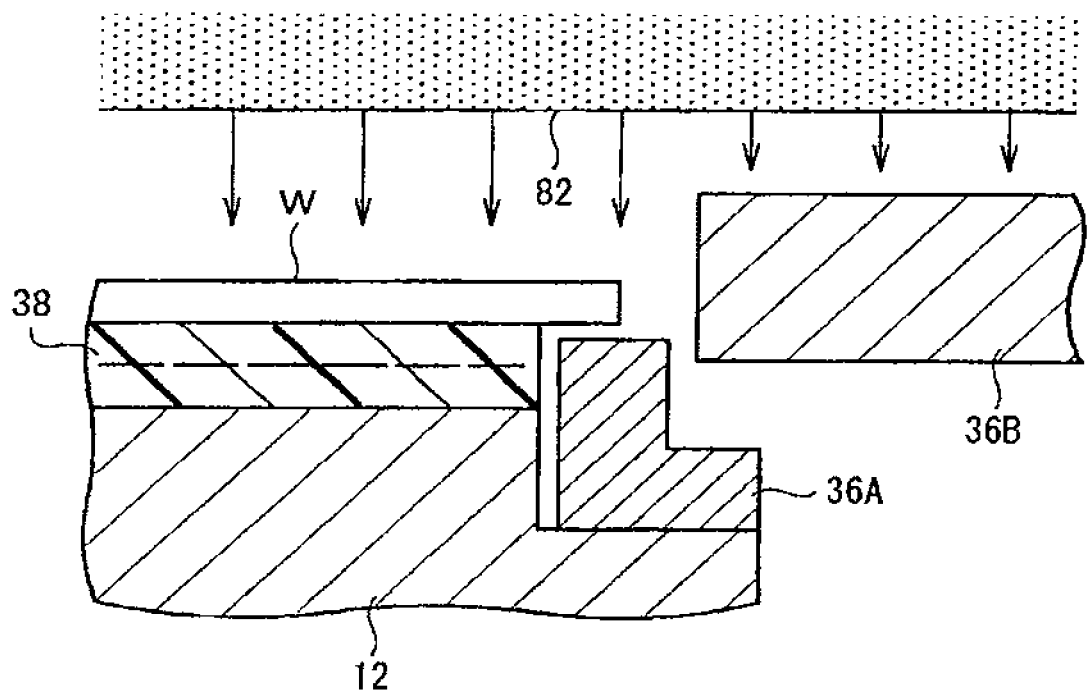
FIG. 9A depicts a partial enlarged cross sectional view for explaining effects of the configuration of FIG. 8.

Further, by positioning the top surface of the focus ring 36B slightly higher than the main surface (top surface) of the semiconductor wafer W attracted and held on the main electrostatic chuck 38, a sheath-bulk plasma interface 82 of an ion sheath formed along the semiconductor wafer W and the focus ring 36A and 36B can be formed as a horizontal surface having no stepped portion, as shown in FIG. 9A. Accordingly, a direction of an electric field vector in the ion sheath, i.e., an ion attracting direction, can be perpendicular to the semiconductor wafer W and the focus ring 36B. When the ions are attracted in the perpendicular direction near a boundary between the semiconductor W and the focus ring 36B, it is possible to realize the verticality of the etching process in a vicinity of the edge portion of the semiconductor wafer W, and also possible to effectively suppress the effects of ion bombardment on the main surface of the wafer.

Figure 9B:
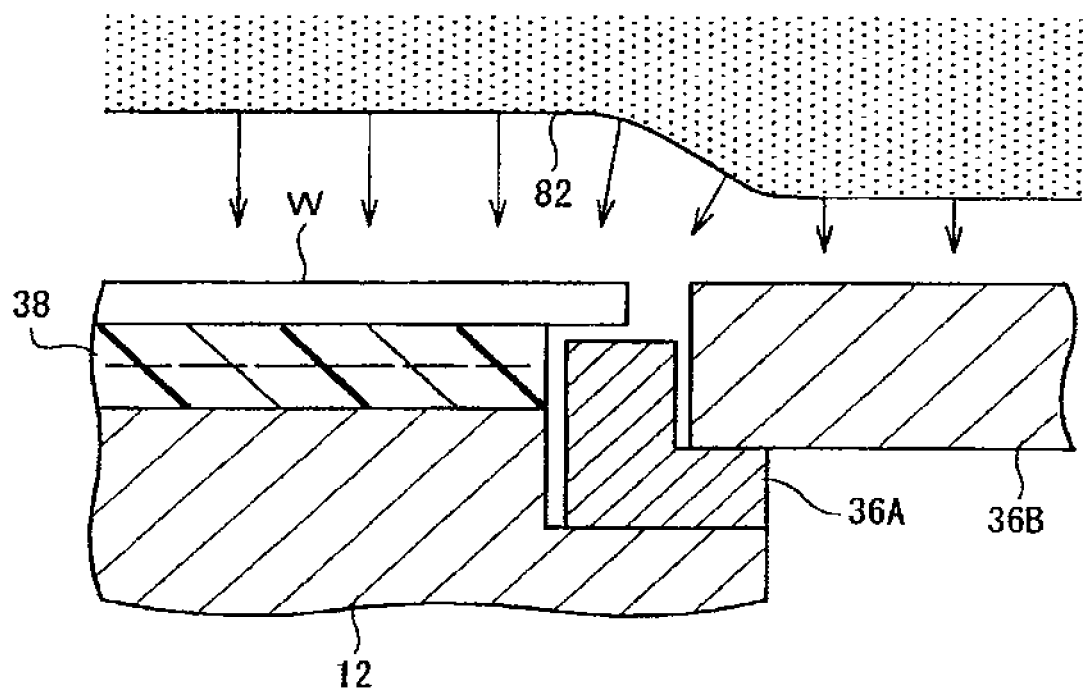
FIG. 9B describes a partial enlarged cross sectional view for explaining the effects of the configuration of FIG. 8.

Meanwhile, if the top surface of the semiconductor wafer W and the top surface of the focus ring 36B have the same height (being on the same plane) as shown in FIG. 9B, a stepped portion or an inclination is formed on the sheath-bulk plasma interface 82 above the boundary between the semiconductor wafer W and the focus ring 36B. As a result, the number of ions slantingly bombarding the vicinity of the edge portion of the semiconductor wafer W increases.

The ion sheath formed directly above the focus ring 36B is thinner than that formed directly above the semiconductor wafer W. This is because the propagation of the high frequency is suppressed in the focus ring 36B side in the present invention and, thus, the electron current is reduced.

Figure 10:
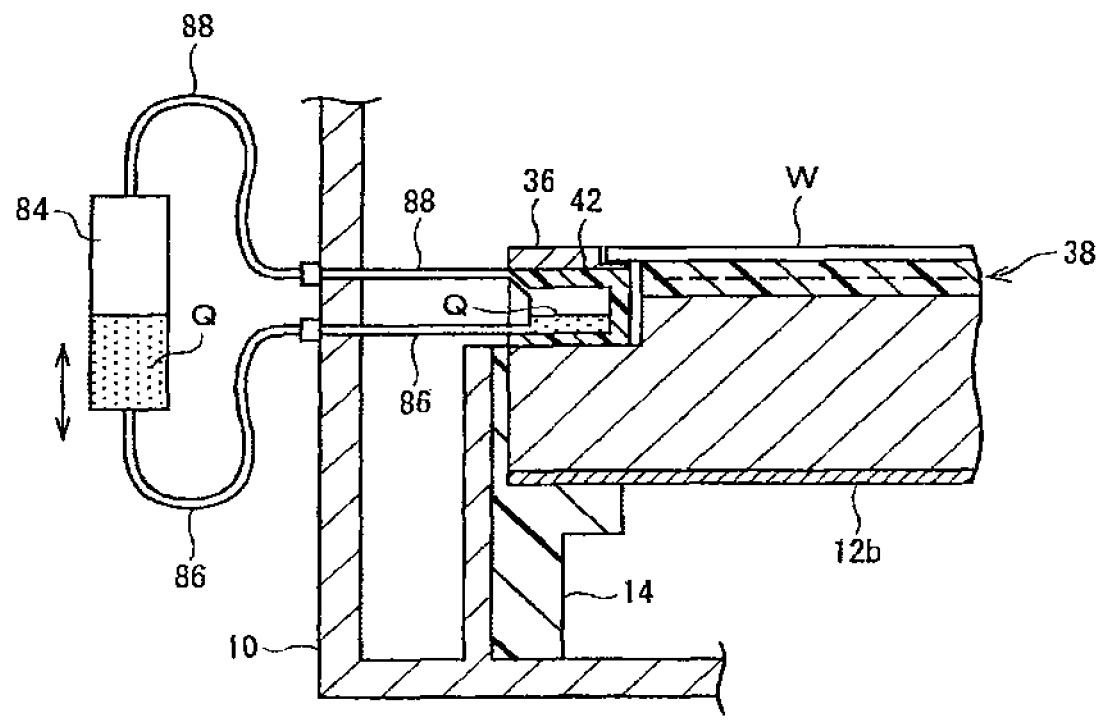
FIG. 10 shows a partial enlarged cross sectional view illustrating a configuration of principal parts of an application example in the embodiment of the present invention.

In the application example of FIG. 10, the peripheral dielectric member 42 provided between the focus ring 36 and the susceptor 12 is formed as a hollow ring, and stores therein dielectric liquid Q of a high dielectric constant, such as Galden, Fluorinert or the like whose volume can be varied. More specifically, in order to vary the volume of the liquid Q in the peripheral dielectric member 42, the dielectric liquid Q is stored and preserved in a tank 84 installed outside the chamber 10, and the tank 84 and the hollow ring-shaped peripheral dielectric member 42 are connected through a communication pipe 86 and a band pipe 88. Since the liquid Q in the tank 84 flows to the hollow ring-shaped dielectric member 42 via the communication pipe 86, the height of a liquid surface in the tank 84 is directly related with that in the hollow ring-shaped peripheral dielectric member 42. Therefore, by adjusting the height position of the tank 84, it is possible to vary the height of the liquid surface in the hollow ring-shaped peripheral dielectric member 42 and further the volume of the conductive liquid Q.

Moreover, by varying the volume of the liquid Q in the peripheral dielectric member 42, the electrostatic capacitance of the entire peripheral dielectric member 42 can be varied. A conductor used as an electrostatic chuck (not shown) may be provided, e.g., on an inner upper wall of the peripheral dielectric member 42.

Figure 11:
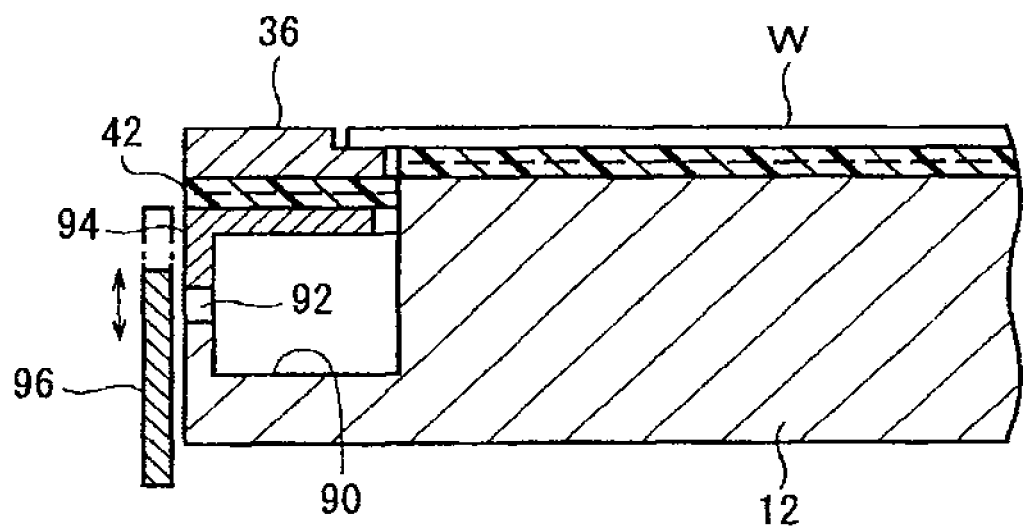
FIG. 11 provides a partial enlarged cross sectional view depicting a configuration of principal parts of an application example in the embodiment of the present invention.

In the application example of FIG. 11, a mechanism for varying an electrostatic capacitance hardwarely or mechanically is provided between the focus ring 36 and the susceptor 12. To be more specific, a ring-shaped recess 90 is formed in an outer peripheral portion on the main surface of the susceptor 12 and, also, a ring-shaped conductor 94 is disposed above the recess 90 separated from susceptor 12 with a gap 92. Further, the peripheral dielectric member 42 and the focus ring 36 are deposited on the conductor 94 in that order.

Moreover, a ring-shaped or a circular arc-shaped variable capacity coupling member 96 is provided at an outer side (in a radial direction) of the ring-shaped recess 90 and the ring-shaped conductor 94 so that it can be vertically shifted. By adjusting the height position of the variable capacity coupling member 96, it is possible to vary a facing area between the variable capacity coupling member 96 and the ring-shaped conductor 94, and further to vary the electrostatic capacitance between the recess 90 of the susceptor 12 and the focus ring 36.

Although it is not illustrated, there can be employed a configuration that a conventional variable capacitor is electrically connected between the susceptor 12 and the focus ring 36, instead of providing the electrostatic capacitance varying mechanism using the dielectric liquid Q whose volume can be varied or the hardwarely variable capacity coupling member 96.

By varying the electrostatic capacitance between the focus ring 36 and the susceptor 12 by using the above electrostatic capacitance varying mechanism or the variable capacitor, it is possible to control the ion sheath distribution or the plasma density distribution on the semiconductor wafer W and the focus ring 36 at will.

Figure 12:
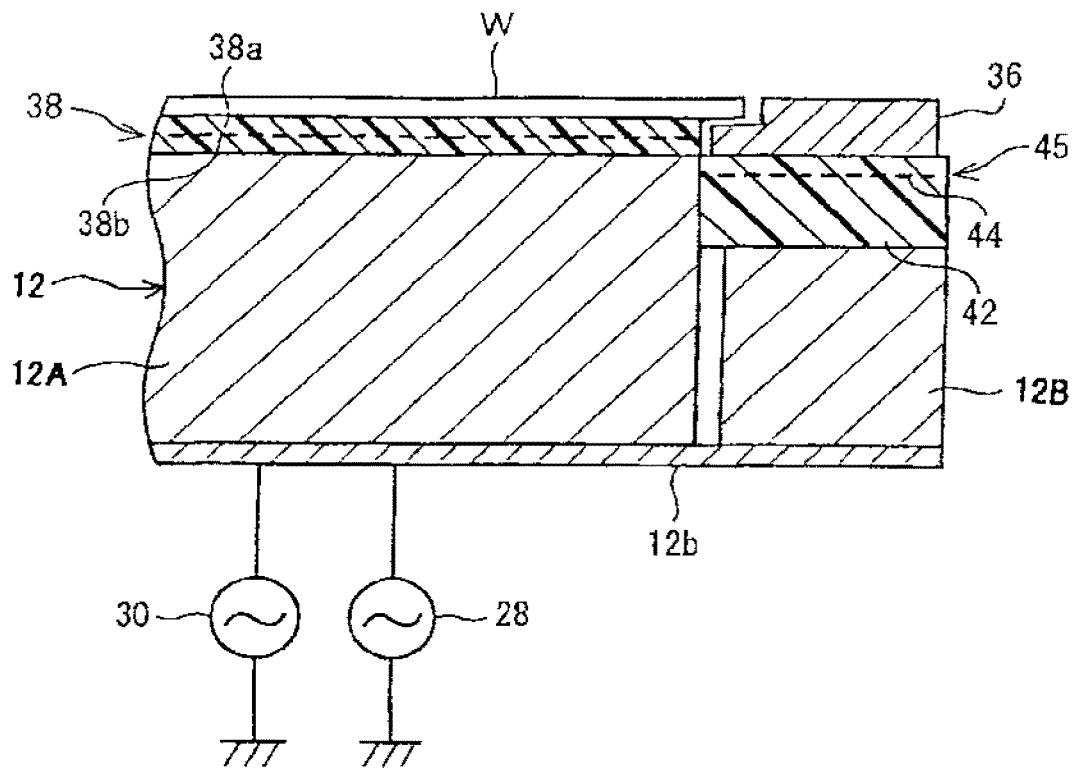
FIG. 12 offers a partial enlarged cross sectional view describing a configuration of principal parts of an application example in the embodiment of the present invention.
Figure 13:
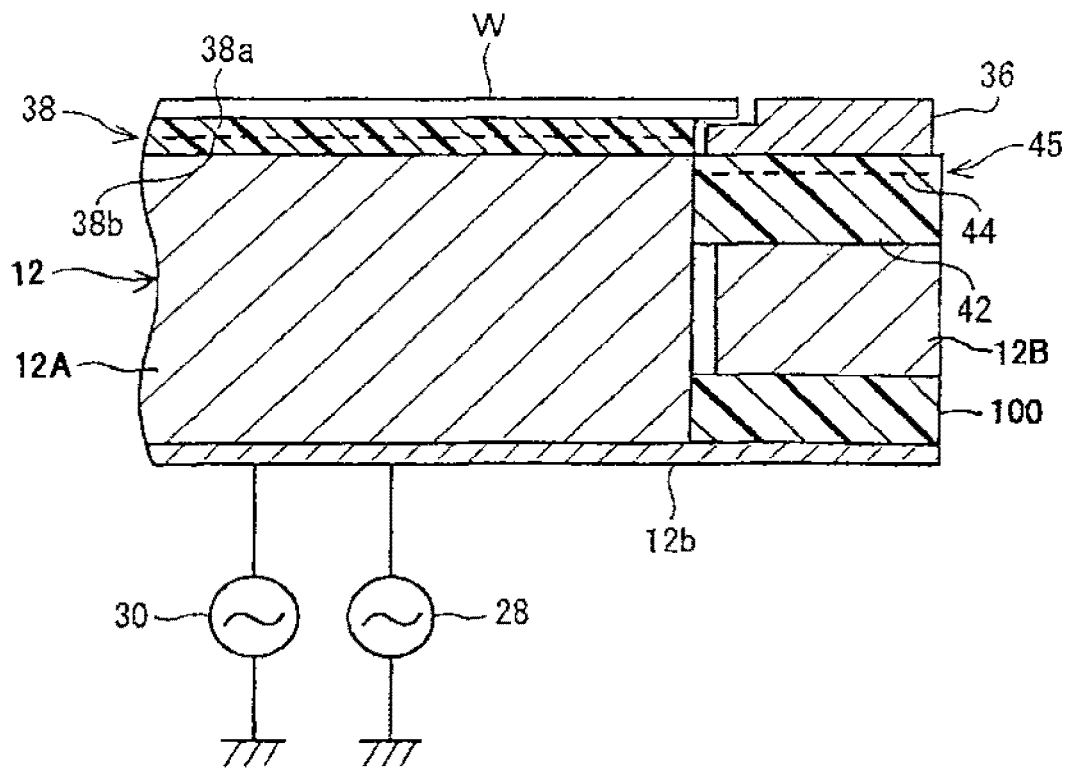
FIG. 13 presents a partial enlarged cross sectional view showing a configuration of principal parts of an application example in the embodiment of the present invention.

FIGS. 12 and 13 present application examples related to the susceptor structure. In these application examples, the susceptor 12 is divided into two pieces, i.e., a circular plate-shaped main susceptor 12A having substantially the same diameter as that of the main electrostatic chuck 38 and a peripheral susceptor 12B extending in a ring shape to surround an outer periphery of the main susceptor 12A while being electrically insulated from the main susceptor 12A.

FIG. 12 shows a configuration that the peripheral susceptor 12B, the peripheral dielectric member 42, the peripheral electrostatic chuck 45 and the focus ring 36 are stacked on top of one another on an RF plate 12b in that order.

FIG. 13 depicts a configuration in which a ring-shaped peripheral dielectric member 100 is inserted between the RF plate 12b and the peripheral susceptor 12B. In this case, the electrostatic capacitance of the lower peripheral dielectric member 100 is electrically connected in series with that of the upper peripheral dielectric member 42 and the combined capacitance of the series capacitor circuit becomes the entire electrostatic capacitance.

Figure 14:
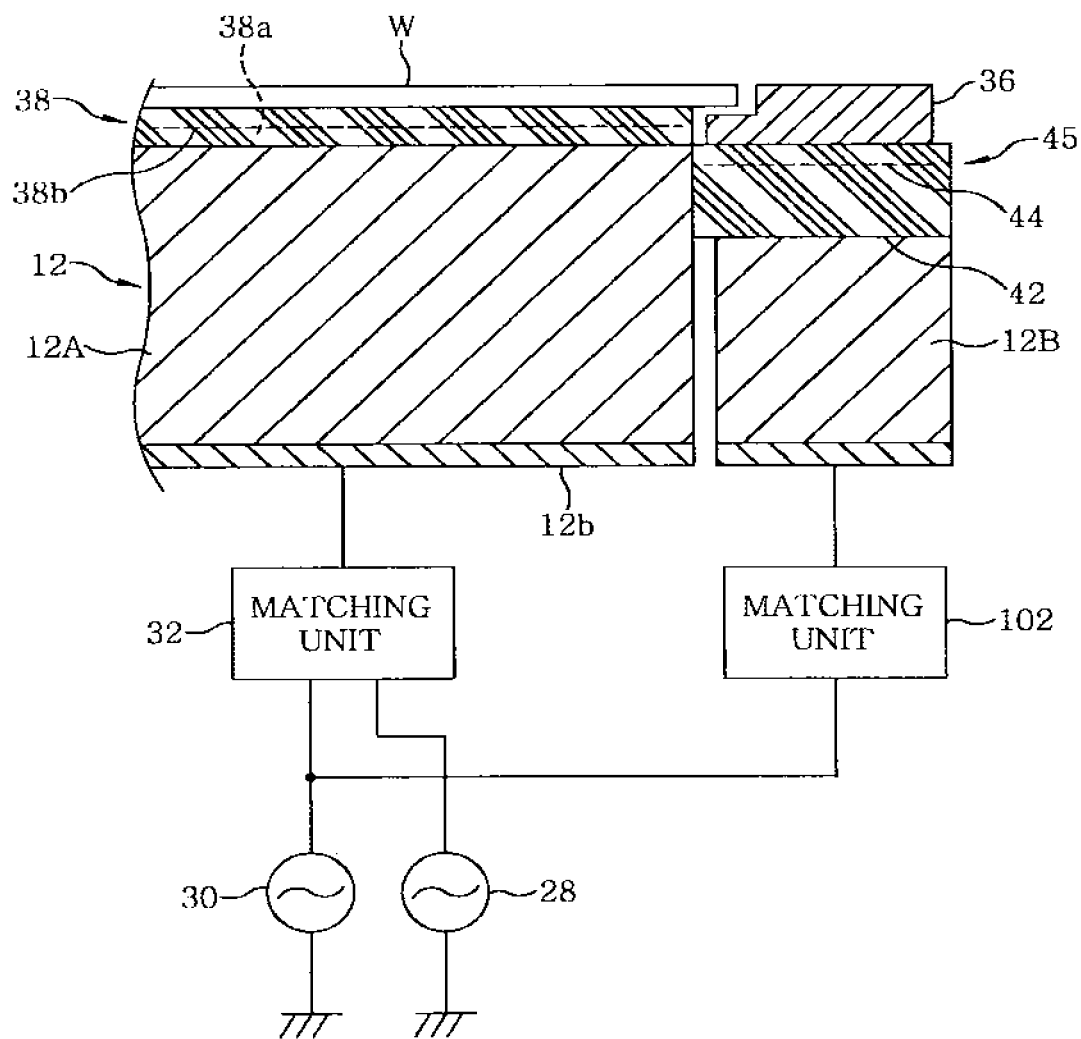
FIG. 14 represents a partial enlarged cross sectional view illustrating a configuration of principal parts of an application example in the embodiment of the present invention.
Figure 15:
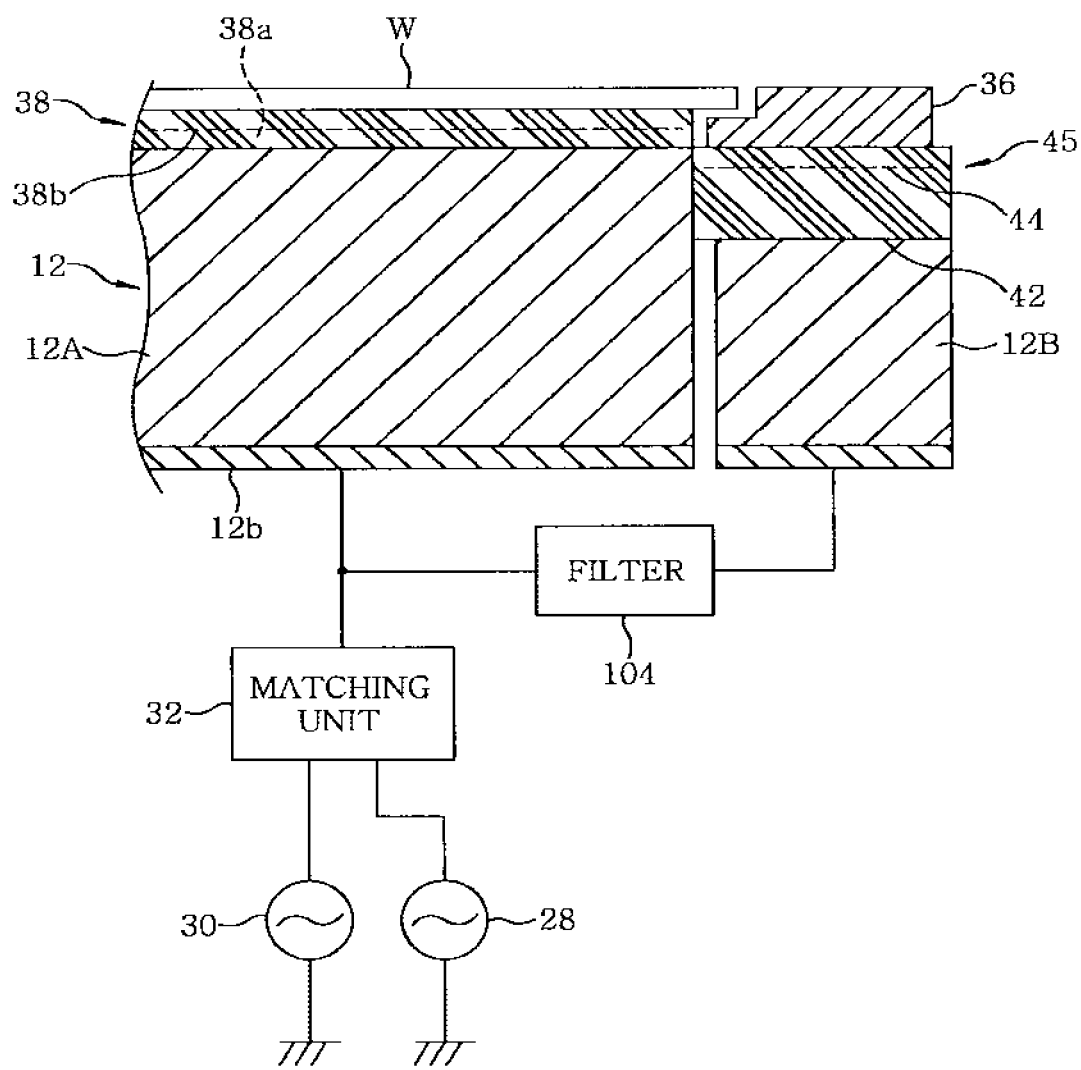
FIG. 15 sets forth a partial enlarged cross sectional view representing a configuration of principal parts of an application example in the embodiment of the present invention.

The susceptor structure shown in FIG. 12 or 13 can also be used in the application examples of FIGS. 14 and 15. In these application examples, the first high frequency (40 MHz) that is relatively high is applied to the main susceptor 12A and the peripheral susceptor 12B, and the second high frequency (2 MHz) that is relatively low is applied only to the main susceptor 12A. To be more specific, in the configuration of FIG. 14, an output of the first high frequency power supply 30 is applied to the main susceptor 12A via the matching unit 32 and also to the peripheral susceptor 12B via a matching unit 102. Here, the matching unit 102 controls an impedance of the first high frequency power supply 30 and that of the load side (the peripheral susceptor 12B, the peripheral electrostatic chuck 45, the focus ring 36, the plasma, the chamber 10 and the like).

Moreover, in the configuration of FIG. 15, an output terminal of the matching unit 32 is electrically connected to the main susceptor 12A and also to the peripheral susceptor 12B via a filter 104. Preferably, the filter 104 is a band pass filter or a high pass filter for passing the first high frequency (40 MHz) while blocking the second high frequency (2 MHz). A thickness of the peripheral dielectric member 42 need not be so thick and may be as small as that of the dielectric member 38a of the main electrostatic chuck 38.

In the configuration that the second high frequency (2 MHz) is applied only to the main susceptor 12A without being applied to the peripheral susceptor 12B, a strong electric field for attracting ions can be formed only on the main susceptor 12A, but substantially not on the peripheral susceptor 12B. Therefore, the anisotropic etching can be performed on the semiconductor wafer W by attracting ions from the plasma, and the ion bombardment on the focus ring 36 can be greatly suppressed or reduced.

Meanwhile, the first high frequency (40 MHz) is divided and transmitted toward the processing space via a path of the main susceptor 12A side and that of the peripheral susceptor 12B side and, then, the etching gas is plasma-excited above the focus ring 36 as well as above the semiconductor wafer W. Since the plasma is generated above the focus ring 36 as well as above the semiconductor wafer W, the characteristics of the plasma density distribution on the semiconductor wafer W can be improved.

While the invention has been shown and described with respect to the embodiments, it will be understood by those skilled in the art that various changes and modifications may be made without departing from the scope of the invention.

For example, the plasma etching apparatus of the aforementioned embodiment employs a lower side dual frequency application type in which the first high frequency (40 MHz) and the second high frequency (2 MHz) are applied to the susceptor 12. The respective frequencies of the first and the second high frequency power used in the above embodiment are only examples, and a frequency can be selected at will depending on processes. In general, the frequency of the first high frequency power for contributing to plasma generation is greater than or equal to 13.56 MHz, and that of the second high frequency power for contributing to attract ions to the substrate or the upper electrode is smaller than or equal to 13.56 MHz. Besides, the present invention is not limited to the lower side dual frequency application type, and can also be applied to a lower side single frequency application type in which a single appropriate frequency is applied to the susceptor 12, an upper/lower side dual frequency application type in which two different frequencies are applied to the susceptor 12 and the upper electrode 56, respectively, or the like.

Further, the present invention is not limited to the plasma etching, and can also be applied to other plasma processing, e.g., plasma CVD, plasma oxidation, plasma nitrification, sputtering or the like. Moreover, the target substrate of the present invention is not limited to the semiconductor wafer, and can be selected from various substrates for flat panel displays, a photomask, a CD substrate, a printed circuit board and the like.

What is claimed is:

1. A plasma processing apparatus comprising:
   an evacuable processing chamber;
   a first electrode configured to support a target substrate in the processing chamber;
   a processing gas supply configured to supply a processing gas to a processing space of the processing chamber;
   a main dielectric member disposed at a substrate mounting region over the first electrode;
   a peripheral dielectric member disposed over a peripheral portion of the first electrode on an outer side of the substrate mounting region;
   a focus ring disposed on the peripheral dielectric member; and
   a first conductor provided in the peripheral dielectric member and configured to generated a first electrostatic attraction force to the focus ring when a direct current (DC) voltage is applied to the first conductor,
   wherein the focus ring comprises a first ring-shaped member disposed near an outer edge of the main dielectric member and a second ring-shaped member disposed near an outer peripheral surface of the first ring-shaped member,
   wherein a bottom surface of each of the first and the second ring-shaped members is in direct contact with an upper surface of the peripheral dielectric member, and
   wherein the first conductor provided in the peripheral dielectric member is disposed only under a portion of the upper surface of the peripheral dielectric member that is in contact with the second ring-shaped member.

2. The plasma processing apparatus of claim 1, further comprising a second conductor provided in the main dielectric member configured to generate a second electrostatic attraction force to the target substrate that is placed on the main dielectric member when the DC voltage is applied to the second conductor.

3. The plasma processing apparatus of claim 1, wherein the peripheral dielectric member is integratedly formed with the main dielectric member.

4. The plasma processing apparatus of claim 1, wherein the first ring-shaped member is disposed so that a gap formed between an outer edge of the target substrate that is placed on the main dielectric member and an inner peripheral surface of the second ring-shaped member is positioned above the first ring-shaped member.

5. The plasma processing apparatus of claim 1, wherein the first conductor is provided in the peripheral dielectric member and arranged in parallel with an upper surface of the peripheral dielectric member.

6. The plasma processing apparatus of claim 1, further comprising:
   a second electrode disposed in the processing chamber, the processing space of the processing chamber being defined between the first electrode and the second electrode; and
   a first high frequency power supply configured to apply a first high frequency power having a first frequency to either the first electrode or the second electrode,
   wherein the peripheral dielectric member is disposed over the peripheral portion of the first electrode so that an electrostatic capacitance per unit area applied between the first electrode and the focus ring is smaller than an electrostatic capacitance per unit area applied between the first electrode and the target substrate that is placed on the main dielectric member.

7. The plasma processing apparatus of claim 6, further comprising a second high frequency power supply configured to apply to the first electrode a second high frequency power having a second frequency lower than the first frequency.

8. The plasma processing apparatus of claim 1, wherein a thermally conductive gas is provided between the main dielectric member and the target substrate and between the peripheral dielectric member and the focus ring.

9. The plasma processing apparatus of claim 1, wherein the peripheral dielectric member is made of a same material forming the main dielectric member.

10. The plasma processing apparatus of claim 1, wherein the peripheral dielectric member has a thickness greater than a thickness of the main dielectric member.

11. The plasma processing apparatus of claim 1, wherein an inner peripheral surface of the second ring-shaped member is disposed to cover the outer peripheral surface of the first ring-shaped member.

12. An assembly for use in a plasma processing apparatus, comprising:
an electrode configured to support a target substrate;
a main dielectric member disposed at a substrate mounting portion region over the electrode;
a peripheral dielectric member disposed over a peripheral portion of the electrode on an outer side of the substrate mounting region;
a focus ring disposed on the peripheral dielectric member; and
a first conductor provided in the peripheral dielectric member and configured to generate a first electrostatic attraction force to the focus ring when a direct current (DC) voltage is applied to the first conductor,
wherein the focus ring comprises a first ring-shaped member disposed near an outer edge of the main dielectric member and a second ring-shaped member disposed near an outer peripheral surface of the first ring-shaped member,
wherein a bottom surface of each of the first and the second ring-shaped members is in direct contact with an upper surface of the peripheral dielectric member, and
wherein the first conductor provided in the peripheral dielectric member is disposed only under a portion of the upper surface of the peripheral dielectric member that is in contact with the second ring-shaped member.

13. The assembly of claim 12, further comprising a second conductor provided in the main dielectric member configured to generate a second electrostatic attraction force to the target substrate that is placed on the main dielectric member when the DC voltage is applied to the second conductor.

14. The assembly of claim 12, wherein the peripheral dielectric member is integratedly formed with the main dielectric member.

15. The assembly of claim 12, wherein the first ring-shaped member is disposed so that a gap formed between an outer edge of the target substrate that is placed on the main dielectric member and an inner peripheral surface of the second ring-shaped member is positioned above the first ring-shaped member.

16. The assembly of claim 12 wherein the first conductor is provided in the peripheral dielectric member and arranged in parallel with an upper surface of the peripheral dielectric member.

17. The assembly of claim 12, wherein the peripheral dielectric member is disposed over the peripheral portion of the electrode so that an electrostatic capacitance per unit area applied between the electrode and the focus ring is smaller than an electrostatic capacitance per unit area applied between the electrode and the target substrate that is placed on the main dielectric member.

18. The assembly of claim 12, wherein a thermally conductive gas is provided between the main dielectric member and the target substrate and between the peripheral dielectric member and the focus ring.

19. The assembly of claim 12, wherein the peripheral dielectric member is made of a same material forming the main dielectric member, and
wherein the peripheral dielectric member has a thickness greater than a thickness of the main dielectric member.

20. The assembly of claim 12, wherein an inner peripheral surface of the second ring-shaped member is disposed to cover the outer peripheral surface of the first ring-shaped member.

* * * * *